United States Patent
Jain et al.

(10) Patent No.: US 7,546,563 B2
(45) Date of Patent: Jun. 9, 2009

(54) VALIDATING ONE OR MORE CIRCUITS USING ONE OF MORE GRIDS

(75) Inventors: Jawahar Jain, Santa Clara, CA (US);
Subramanian K. Iyer, Austin, TX (US);
Mukul R. Prasad, Sunnyvale, CA (US);
Thomas W. Sidle, Cupertino, CA (US)

(73) Assignee: Fujitsu Limited, Kawasaki (JP)

( * ) Notice: Subject to any disclaimer, the term of this patent is extended or adjusted under 35 U.S.C. 154(b) by 430 days.

(21) Appl. No.: 11/170,470

(22) Filed: Jun. 28, 2005

(65) Prior Publication Data
US 2008/0072190 A1     Mar. 20, 2008

(51) Int. Cl.
*G06F 17/50*     (2006.01)
(52) U.S. Cl. .......................................... 716/5
(58) Field of Classification Search ................. 716/4–5
See application file for complete search history.

(56) References Cited

U.S. PATENT DOCUMENTS

| | | | |
|---|---|---|---|
| 2004/0093571 A1* | 5/2004 | Jain et al. | 716/5 |
| 2004/0210860 A1* | 10/2004 | Ganai et al. | 716/5 |
| 2008/0066032 A1* | 3/2008 | Levitt et al. | 716/5 |

OTHER PUBLICATIONS

Amla et al., "Experimental Analysis of Different Techniques for Bounded Model Checking," TACAS, vol. 2619 of LNCS, 15 pgs, Apr. 2003.

Asato et al., "Grid Middleware for Effectively Utilizing Computing Resources: CyberGRIP," Fujitsu Scientific and Technical Journal, vol. 40, pp. 261-268, Dec. 2004.

Biere, et al., "Verifying Safety Properties of a PowerPC™ Microprocessor Using Symbolic Model Checking without BDDs," CAV, vol. 1633 of LNCS, pp. 60-71, Jul. 1999.

Bjesse et al., "Finding Bugs in an Alpha Microprocessor Using Satisfiability Solvers," CAV, vol. 2102 or LNCS, 12 pgs, Jul. 2001.

Cabodi et al., "Improving SAT-based Bounded Model Checking by Means of BDD-based Approximate Traversals," In Proc. of the Design Automation and Test in Europe, pp. 6 pgs, Mar. 2003.

Clarke et al., "Bounded Model Checking using Satisfiability Solving," Formal Methods in System Design, 20 pgs, Jul. 2001.

Copty, et al., "Benefits of Bounded Model Checking at an Industrial Setting," CAV, 25 pgs, Jul. 2001.

Feldman, et al., "Parallel Multithreaded Satisfiability Solver: Design and Implementation," PDMC, 15 pgs, 2004.

Ganai et al., "Enhancing Simulation with BDDs and ATPG," The University of Texas at Austin, 39 pgs, Dec. 1998.

(Continued)

*Primary Examiner*—Paul Dinh
(74) *Attorney, Agent, or Firm*—Baker Botts L.L.P.

(57) ABSTRACT

In one embodiment, a method for validating one or more circuits using one or more grids includes accessing a circuit and generating one or more seeds for executing one or more instances of validation on the circuit. Each instance of validation comprising one or more tasks. The method also includes distributing the tasks and the seeds across a grid including multiple nodes and, using the seeds, executing the instances of validation at the nodes in the grid according to the tasks.

17 Claims, 5 Drawing Sheets

OTHER PUBLICATIONS

Ganai, et al., "Efficient Distributed SAT and SAT-based Distributed Bounded Model Checking," CHARME, 15 pgs, 2003.

Garavel et al., "Parallel State Space Construction for Model-Checking," SPIN workshop on Model checking of software, Springer-Verlag New York, Inc., 22 pgs, 2001.

Grumberg et al., "Distributed Symbolic Model Checking for µ-calculus," Computer Aided Verification, 13 pgs, 2001.

Gupta et al., "Abstraction and BDDs Complement SAT-Based BMC in DiVer," Proc. of the 15th Conf. on Computer-Aided Verification, vol. 2725 of LNCS, 4 pgs, Jul. 2003.

Gupta et al., "Learning from BDDs in SAT-based Bounded Model Checking," Proc. of the 40th Design Automation Conf., pp. 824-829, Jun. 2003.

Hazelhurst et al., "A Hybrid Verification Approach: Getting Deep into the Design," Proc. of the 39th Design Automation Conf., 6 pgs, Jun. 2002.

Heyman, et al., "Achieving Scalability in Parallel Reachability Analysis of Very Large Circuits," CAV, 19 pgs, May 30, 2000.

Ho et al., "Smart Simulation Using Collaborative Formal and Simulation Engines," Proc. of the IEEE/ACM International Conference on Computer-Aided Design, 7 pgs, Nov. 2000.

Iyer et al., "A Fast Sequential SAT Engine for Circuits," Proc. of the IEEE/ACM International Conference on Computer-Aided Design, 7 pp. 320-325, Nov. 2003.

Jain et al., "On Analysis of Boolean Functions," Ph.D. Dissertation, Dept. of Electrical and Computer Engineering, The University of Texas at Austin, 176 pgs, May 1993.

Kuehlmann et al., "Robust Boolean Reasoning for Equivalence Checking and Functional Property Verification," IEEE Trans. on CAD, pp. 1377-1394, Dec. 2002.

Kuehlmann et al., "Probabilistic State Space Search," Proc. of the IEEE/ACM International Conference on Computer-Aided Design, 6 pgs, Nov. 1999.

Moskewicz et al., "Chaff: Engineering an Efficient SAT Solver," Proc. of the 38th Design Automation Conf., 6 pgs, Jun. 2001.

Moon et al. "Lease Fixpoint Approximations for Reachability Analysis," ICCAD, 4 pgs, 1999.

Narayan et al., "Partitioned ROBDDs—A Compact, Canonical and Efficiently Manipulate Representation for Boolean Functions," ICCAD 8 pgs, 1996.

Sahoo et al., "A Partitioning Methodology for BDD-based Verification," FMCAD, 15 pgs, 2004.

Stern et al., "Parallelizing the Murphy Verifier," CAV, 12 pgs, 1997.

Stornetta et al., "Implementation of an Efficient Parallel BDD Package," DAC, 50 pgs, Dec. 1995.

Yang et al., "Parallel Breadth-First BDD Construction," In symposium on Principles and practice of parallel programming, ACM Press, 12 pgs, 1997.

Yang et al., "Validation with Guided Search of the State Space," Proc. of the 39th Design Automation Conf., 6 pgs, Jun. 1998.

Yalagandula et al., "Automatic Lighthouse Generation for Directed State Space Search," In Proc. of the Design Automation and Test in Europe, pp. 6 pgs, Mar. 2000.

\* cited by examiner

ALL JOBS TO BE EXECUTED ARE SUBMITTED AND EXECUTED
a) CONVENTIONAL CASE

JOBS JUDGED UNNECESSARY TO EXECUTE
(x > n) ARE AUTOMATICALLY CANCELLED
b) CASE USING OJC

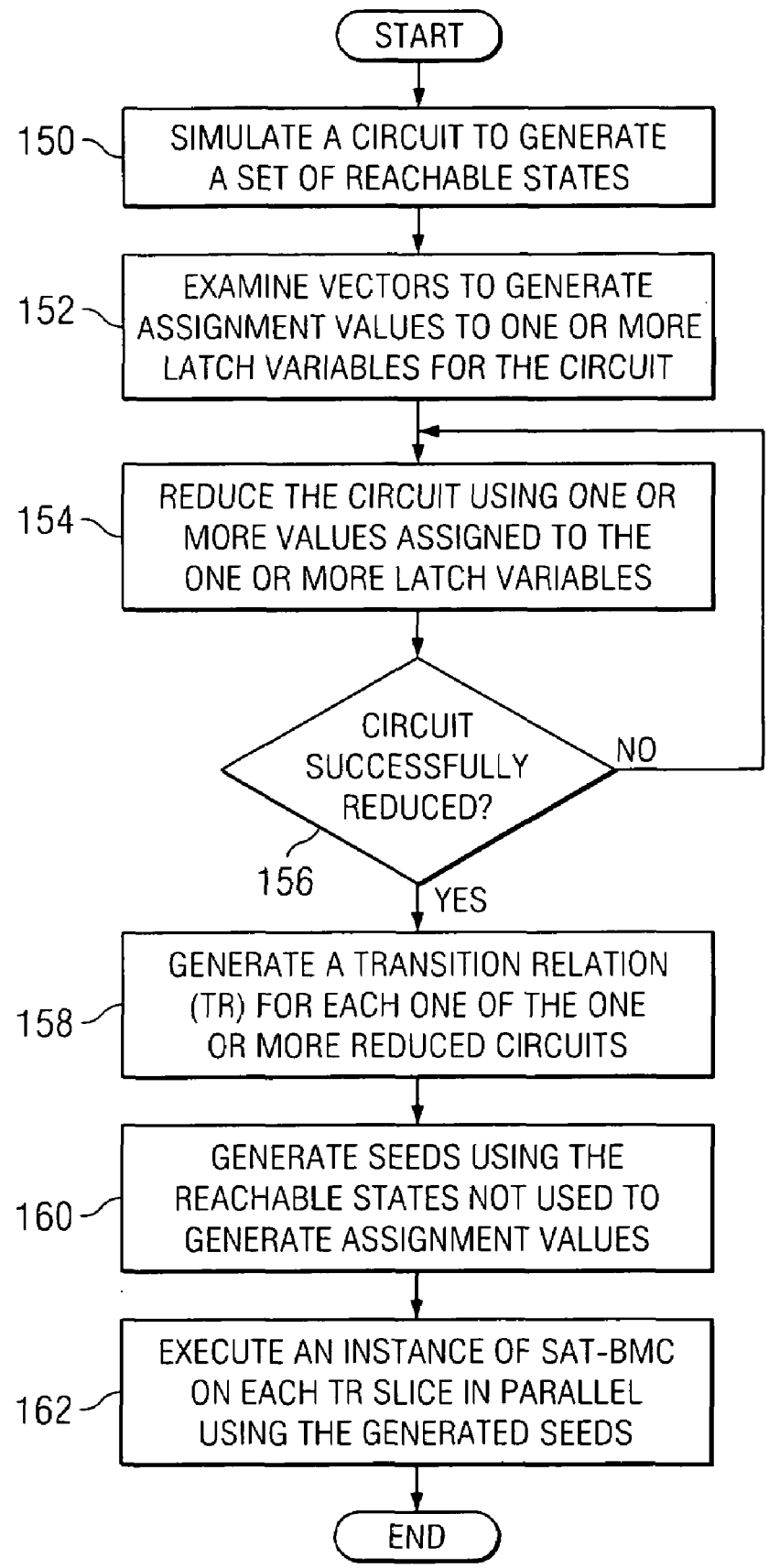

VALIDATING ONE OR MORE CIRCUITS USING ONE OF MORE GRIDS

TECHNICAL FIELD OF THE INVENTION

This invention relates generally to circuit verification and more particularly to validating one or more circuits using one or more grids.

BACKGROUND

Formal verification, especially error detection, is rapidly increasing in importance with the rising complexity of designs. A typical constraint in verification is the total amount of resources available, including time and memory. Satisfiability (SAT)-based bounded model checking (BMC) approaches are often a preferred method for detecting error states that are not very deep. However, these techniques can become quite expensive when many time-frames are required to be tested. Binary Decision Diagram (BDD) based approaches are better choices for those deep cases where the image BDDs remain moderately small, as constructing large BDDs for many image steps can be very expensive.

SUMMARY

The present invention may reduce or eliminate disadvantages, problems, or both associated with validating one or more circuits.

In one embodiment, a method for validating one or more circuits using one or more grids includes accessing a circuit and generating one or more seeds for executing one or more instances of validation on the circuit. Each instance of validation comprising one or more tasks. The method also includes distributing the tasks and the seeds across a grid including multiple nodes and, using the seeds, executing the instances of validation at the nodes in the grid according to the tasks.

Particular embodiments of the present invention may provide one or more technical advantages. As an example, a hybrid of the SAT-based BMC (or SAT-BMC) and BDD algorithms may allow various candidate deep states to be found that can be seeds from which SAT-BMC can be run in parallel to explore the adjacent state-space. Starting from such potential deep seed states, multiple BMC runs may be able to reach further deep states and conduct analysis, which may be out of reach for existing methods. The state-space may be examined by starting multiple BMC runs, one from each seed. To keep the runtime practical, the runs are made in parallel. The computing power of a grid, which uses otherwise idle central processing unit (CPU) cycles from a large number of nodes, is used to accomplish the parallel runs. Particular embodiments are able to systematically examine multiple Partitioned Reduced Ordered Binary Decision Diagram (POBDD) representations constructed and analyzed independently on different nodes of a grid.

Particular embodiments provide a non-traditional way to parallelize BMC that allows for multiple-BMC runs to be fired in parallel to concurrently explore different state-space regions. Embodiments lie at the cross-roads of two bodies of work, namely, hybrid techniques for smart simulation or efficient bug-finding and recent efforts for performing verification in a parallel framework. Because BMC methods are now de-facto standard for failing properties and BDD-based methods are typically the choice for proving the property correct, particular embodiments are designed to automatically handle either case, as it may arise. Particular embodiments may significantly augment the state of the art in analyzing circuits.

Particular embodiments of the present invention provide all, some, or none of the above technical advantages. Particular embodiments may provide one or more other technical advantages, one or more of which may be readily apparent to a person skilled in the art from the FIGUREs, description, and claims herein.

BRIEF DESCRIPTION OF THE DRAWINGS

To provide a more complete understanding of the present invention and the features and advantages thereof, reference is made to the following description taken in conjunction with the accompanying drawings, in which:

FIG. 10 illustrates an example method for processing one or more relatively large circuits for analysis.

DETAILED DESCRIPTION OF THE DRAWINGS

Figure 1:
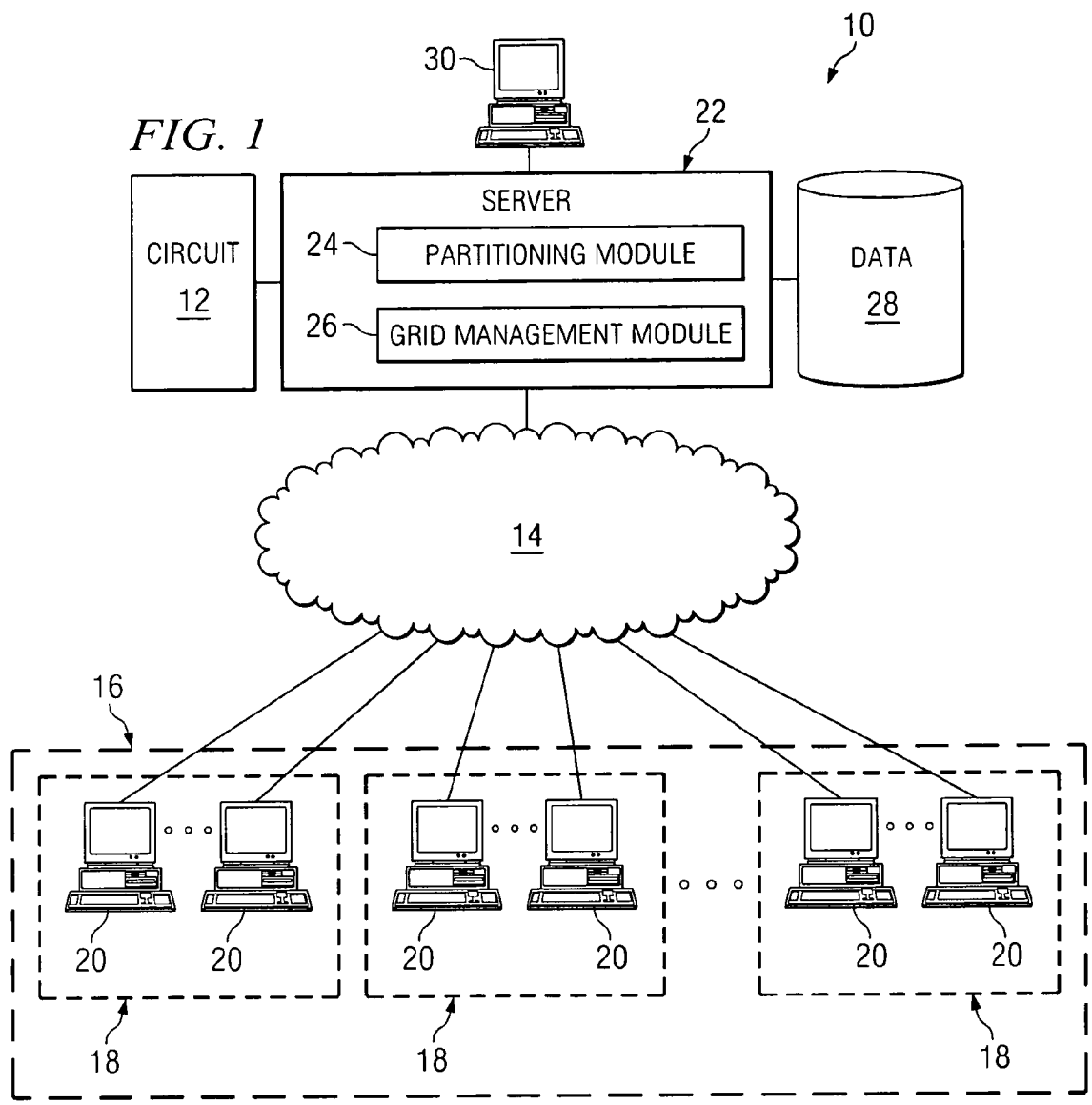
FIG. 1 illustrates an example system for analyzing one or more circuits using one or more grids.

FIG. 1 illustrates an example system 10 for analyzing one or more circuits using one or more grids. System 10 includes a circuit 12 for testing. As an example and not by way of limitation, testing circuit 12 may include detecting one or more errors in circuit 12, verifying one or more properties of circuit 12, or both. System 10 includes a grid 16, a server 22, and data 28 for testing circuit 12, as described below. One or more links couple components of system 10 to each other. As an example and not by way of limitation, a link may include one or more wires in one or more circuit boards, one or more internal or external buses, one or more local area networks (LANs), one or more metropolitan area networks (MANs), one or more wide area networks (WANs), one or more portions of the Internet, or a combination of two or more such links, where appropriate. In particular embodiments, a network 14 facilitates communication between server 22 and grid 16.

Circuit 12 includes hardware or a logical or other representation of hardware for testing to determine whether the hardware operates properly, e.g., according to one or more particular specifications corresponding to the hardware. As an example and not by way of limitation, circuit 12 may include circuit components such as gates, counters, inverters, buffers, and other circuit components arranged and coupled to each other to provide particular functionality. As another example, circuit 12 may include a logical or other representation of such components. Circuit 12 may include millions of circuit components. To provide a particular functionality, circuit 12 may need to include one or more properties. Circuit 12 may need to include millions of such properties. In particular embodiments, one or more logical expressions may describe a property of circuit 12. Reference to a "property" of circuit 12 may encompass a logically expressible state, characteristic, behavior, or operation of circuit 12 or another property of circuit 12. Reference to a "state" of circuit 12 may encompass a property, where appropriate.

Prior attempts to test circuit 12 only use a single processor. Recently, various attempts have been made to use parallel and distributed methods for analysis. All these approaches assume the presence of a dedicated network of nodes 20 to perform analysis. As personal computers continue to increase in computing capacity, the concept of computation grids is gaining acceptance. Here, a grid 16 is a network of nodes 20 that are dedicated to their individual uses, but may be available some of the time for other tasks. This is a unique environment where parallelism is possible by using otherwise idle CPU cycles from a number of nodes 20. Grid 16 may include two or more subgrids 18. Subgrids 18 are a smaller representation of grid 16. Each subgrid 18 includes one or more nodes 20. Nodes 20 include hardware, software, an embedded logic component, and/or a combination of two or more such components for performing assigned jobs in analyzing circuit 12. As an example and not by way of limitation, node 20 may be one or more desktop computers or one or more laptops. Nodes 20 may be heterogeneous and do not need to be the same. As an example and not by way of limitation, server 22 distributes a single job among nodes 20, where the job is broken into multiple tasks. As another example and not by way of limitation, server 22 may distribute a single job to subgrid 18 or to grid 16. The job, as an example, may include a partition for deep BMC based on criteria assigned by server 22. During the analysis, all nodes 20 of grid 16 may cease working on the task depending on instructions from server 22. In an embodiment, each node 20 may run a single task of the multiple tasks in a job. The completed tasks are combined and presented to server 22 for further analysis. Nodes 20 operate independently of each other, thus it is suitable for scaling verification to a grid 16. In particular embodiments, each node 20 runs simultaneously, i.e., in parallel, in a parallel computer environment.

Server 22 includes hardware, software, an embedded logic component, or a combination of two or more such components for accessing circuit 12 for analysis. A user at a computer system 30 may communicate with server 22 using an interface or through network 14. As an example and not by way of limitation, analyzing circuit 12 includes identifying states in circuit 12, as described below. Server 22 includes a partitioning module 24 and a grid management module 26. Partitioning module 24 includes hardware, software, or an embedded logic component, or a combination of two or more such components for partitioning a state-space of circuit 12, as described below. A state-space of circuit 12 includes all or substantially all states of circuit 12. A partition of a state-space of circuit 12 includes one or more portions of the state-space of circuit 12. Grid management module 26 includes software, an embedded logic component, or a combination of components for managing the computing resources on grid 16, as described below. Data 28 includes data specifying a type of circuit 12 and other data that, in particular embodiments, server 22 uses to test circuit 12. In particular embodiments, one or more nodes 20 provide access to server 22 and data 28. As an example, and not by way of limitation, a user at computer system 30 may access the one or more nodes 20 to provide input to and receive output from server 22 and data 28. As still a further example, a user at computer system 30 may communicate to server 22 and nodes 20 through network 14. As an example and not by way of limitation, computer system 30 includes hardware, software, an embedded logic component, and/or a combination of two or more such components for analyzing circuit 12. As an example and not by way of limitation, computer system 30 may be one or more desktop computers or one or more laptops.

The issues in a grid-computing environment are quite different from those in dedicated parallel computing environments. Because the availability of nodes 20 is not guaranteed, any algorithm that uses such a framework has to be able to withstand receiving either no results or only partial results from certain computations. Secondly, because the computational network is not dedicated at all times to a single task, any task scheduled on grid 16 has to use little network traffic. As far as possible, computations on different nodes 20 need to be independent of each other, with few dependencies. Under such circumstances, traditional algorithms need to be carefully reworked in order to scale to grid-based networks. To identify failing properties, BMC methods are now the defacto standard. SAT-BMC is able to explore the state-space of larger designs by bounding the depth of exploration and successively increasing this bound. Due to notable improvements in the art of satisfiability-testing, SAT-BMC is now routinely applied to test circuit 12 during property verification for many industrial designs. SAT based BMC approaches are the preferred method for detecting error states that are not very deep. However, these techniques can become quite expensive when many time-frames are required to be tested. For proving the property correct, a different method, typically a BDD-based approach, is generally the choice. BDD-based approaches are better choices for those deep cases where the image BDDs remain moderately small as constructing large BDDs for many image steps can be very expensive. Since one does not know a priori whether a property is erroneous or not, often each approach is run on every property, in some order. A practical and efficient grid-based approach may automatically handle both cases.

Techniques that run on a single node 20 have clear limitations due to the limited computing power of their execution environment. Suggestions have been made regarding a distributed approach towards BDD-based model checking as well as parallel SAT solvers. However these methods remain inadequate as they essentially analyze the state-space from a breadth-first centric point of view. The BDD based approaches also require communication between different nodes 20 in the form of large BDDs, which precludes these methods from using large parallel computing environments.

Particular embodiments provide an intuitive and attractive approach to address the above identified class of problems. A hybrid of the SAT-BMC and BDD algorithms allows various candidate deep states to be found that can be seeds from which SAT-BMC can be run in parallel to explore the adjacent state-space. Starting from such potential deep seed states, multiple BMC runs may be able to reach further deep states and conduct analysis, which may be out of reach for existing methods.

Particular embodiments include using BDD-based methods, while the graph sizes are still under control, to generate such seed states. For a few initial steps of reachability, rapid progress can be made using BDDs. However, as the graphs get larger, the BDD-based state-space analysis becomes very expensive. This may severely limit the capability of BDD-based approaches to seed BMC runs. Another problem worth a solution in the above-mentioned hybrid approach is that given many seeds, it is not clear as to which seeds are more important and should be prioritized. Particular embodiments are able to systematically examine multiple POBDD representations constructed and tested independently on different nodes of a grid. This is found to benefit passing properties as well. A practical solution to the above problems may significantly augment the state of the art in analyzing circuit 12.

To control the size of BDDs using state-space analysis, state-space partitioning is used. It has been empirically observed that partitioning provides the means to symbolically explore the state-space deeply. In fact, if each subspace is thought of as a direction, then reachability with partitioning is a localized Breadth First Search (L-BFS) along each such direction. Deep states provided from such L-BFS traversals can be used to provide initial seed states to subsequent BMC runs to help it explore regions that could not be explored before using popular SAT-BMC approaches.

Particular embodiments may apply to any suitable circuit 12. For many circuits 12, the BDD-based analysis can be very expensive, even with partitioning. Thus, the time to generate deep seed states can be prohibitively large. Since the BDD runtime is directly proportional to the size of the graphs, the graph sizes of each partition are further limited using under-approximations. Thus, particular embodiments provide an under-approximation based method on top of partitioned BDDs.

To keep the graph size under control during reachability computation, one must make many partitions. However, in such cases, it is difficult to know a priori as to which partitions provide the best seed states for BMC. Therefore, combining partitioning and BMC is further augmented by generating multiple instances of BMC and running each such case in parallel on grid 16 of nodes 20. This idea looks even more attractive when considering that large computing grids 16 are becoming available in many computing environments. This approach may be used for any suitable analysis of circuit 12. Also, the approach suggests a non-traditional way to parallelize BMC. This work lies at the cross-roads of two bodies of work, namely hybrid techniques for smart simulation or efficient bug-finding and recent efforts for performing verification in a parallel framework.

Using SAT-based or automatic test pattern generation (ATPG) based approaches, it has been possible to process circuits 12 that were not possible to be tested using BDDs. However, previous approaches as described have a nature of a hybrid approach using multiple engines. Thus, they can easily use improvements in the individual technologies, such as SAT or ATPG engines or BMC formulation. Previous research performs a pre-image computation from the target states to provide an enlarged target for simulation. The simulation verification and augmentation SIVA) tool performs the best first search in a simulation environment, augmented with BDDs and SAT, with the hamming distance between the current and target state as the guiding cost function. Other previous approaches used interleaved runs of simulation, BDD-based symbolic simulation and ATPG-based BMC to maximize the state coverage over a set of interesting signals.

In contrast to the above bug hunting approaches, another class of techniques employs a combination of formal engines mainly for the purpose of verifying properties (possibly bounded depth properties). For example, some approaches use BDD-based reachability analysis and compute conjunctive normal form (CNF) clauses through BDD functional analysis to prune the search space of SAT-based BMC, structurally partition the property check into parts solved by SAT and BDDs, and employ a combination of symbolic trajectory evaluation and SAT/BDD based symbolic model checking.

Particular embodiments differ from the above previous approaches in two key aspects. First, simulation forms the search backbone of many of the above methods. This is not the case in the disclosed approach. In the case of hard, deep bugs, a simulation-based approach may not be able to access interesting regions of the search space. Second, the disclosed hybrid approach is formulated in a novel way with the specific aim of being able to generate multiple sub-problems that cover orthogonal regions of the state-space that are then explored in parallel.

Previous hybrid approaches, which combined BDDs and SAT-BMC, used Monolithic Ordered Binary Decision Diagrams (OBDDs) as the chosen data structure, which typically led to a breadth-first processing of the state-space. However, when using OBDDs, it is difficult to control the direction of the search as well as the size of graphs that are typically generated. This makes it often hard to efficiently reach any states (even if arbitrary or only a handful) that are deep in the state-space. In contrast, restricting the analysis to a subset of partitions provides a controlled way to perform deep, albeit partial, coverage. It has been empirically observed that partitioning provides the means to symbolically explore the state-space deeply while still keeping the individual graphs within a partition under control. The size of graphs generated can be further reduced by using under-approximation, albeit at the cost of loss of information. Deep states from such, multiple L-BFS traversals can be used to provide many different initial states to seed subsequent BMC runs. These may then explore regions that could not be explored using traditional SAT-BMC approaches. If any particular L-BFS traversal leads it in a direction which corresponds to an error in the design, then a BMC starting from a corresponding seed can prove to be far more efficient than classical BMC starting from the original initial state. The particular embodiments that provide a more effective methodology have a nature of a hybrid approach using multiple engines.

Typical hybrid approaches do not naturally lend themselves to parallel exploration. The disclosed approach results in a non-traditional, parallel-BMC approach that allows for multiple-BMC runs to be fired in parallel to concurrently explore different state-space regions.

Several other methods have been proposed to do parallel verification. Some parallelize an explicit model checker. In other methods, parallelized BDDs are used for reachability analysis. Analysis using parallel reachability has been studied previously. Particular embodiments are different from other distributed model checking approaches that are geared towards completeness rather than bug hunting. Most techniques are, to a large extent, only parallelizing the breadth-first traversal. Their limitations to reach deep states remain under a severe handicap. Further, these techniques require message passing between different processors in the form of large BDDs. That can severely limit how a large grid 16 can be effectively employed. Another previous method distributes the SAT-based BMC over a network of heterogeneous workstations. That method includes an algorithm to perform distributed binate covering problem (BCP) to solve a large SAT problem. Similarly, in another prior method, a parallel multi-threaded SAT solver is discussed.

Because BMC methods are now the de-facto standard for failing properties, and BDD-based methods are typically the choice for proving the property correct, particular embodiments are designed to automatically handle either case, as it may arise.

BMC based on SAT has a limitation on how deep a state it can explore as it is based on explicitly unrolling multiple time frames, equal in number to the length of the suspected error path. BDDs calculate successive image computations for reachability and can go deep, provided, the size of the transition relation (TR) is manageable and the successive images are small in size. Unfortunately, such images often get large, at a very small depth, and BDDs are unable to make further progress. Even if BDDs do not exhibit dramatic blowup in size, the computed image sets grow in size steadily, until they are so large that the calculations need impractically long time. Thus, for smaller depths, SAT may be able to proceed further as it does not store sets of states, but instead merely computes paths.

Errors may lie relatively deep in a circuit 12. As an example and not by way of limitation, a hardware implementation of an Ethernet switch may carry out initialization over a relatively large number of time-frames. One or more properties of a circuit 12 embodying the hardware implementation of the Ethernet switch would necessarily lie deeper than the initial setup phase. BMC would likely be ineffective at detecting errors deeper than the initial setup phase. A reachability analysis of circuit 12 using BDDs may be an alternative to BMC. Various counter-like circuits 12 are "BDD friendly" in the sense that such circuits 12 have compact BDD representations, but lead to a substantially unmanageable number of SAT clauses. The "B12" circuit 12 from the VIS-Verilog Benchmark suite is an example of such a circuit 12. Accordingly, in various scenarios, BMC is inadequate and error detection using BDDs is needed. BDDs calculate successive image computations for reachability and can go deep, provided the size of the transition relation is manageable and the successive images are small in size. Unfortunately, such images often get large, at a very small depth, and BDDs are unable to make further progress. Even if BDDs do not exhibit a dramatic increase in size, the computed images grow in size steadily, until they are so large as to make calculations take an impractically long time. Therefore, BDDs are better choices for deep cases where the image BDD remains moderately small.

Two key ideas exist for deep exploration. The first is to go deep using BDDs at the expense of completeness, by ensuring that BDD sizes remain tractable. This is accomplished by the use of partitioning and under-approximation. The size of BDDs is controlled and many instances of BMC are generated, which can be run in parallel. Each partition is seeded by a state that is obtained from BDD-based reachability. The second idea is motivated by the fact that incomplete BDD analysis cannot guarantee depth of the seeds generated. Thus, to reach a deep error, the state-space is examined by starting multiple BMC runs, one from each seed. To keep the runtime practical, the runs are made in parallel. This is accomplished by using the computing power of grid 16, which uses otherwise idle CPU cycles from a large number of nodes 20. In particular embodiments, parallelization of BMC based on state-space partitioning is accomplished by executing multiple instances of BMC independently using different parameters or different seed states. These seed states are deep states, selected from the reachable states in different partitions. In particular embodiments, nodes 20 work independently of each other, thus it is suitable for scaling verification to a grid-like system 10. This overcomes the main shortcoming of classical SAT-BMC with its inability to perform deep state exploration. This is a non-conventional way of parallelizing BMC. For the circuits where the BDD-based exploration is able to build the TR cheaply, particular embodiments appear to overcome the main shortcoming of classical SAT-BMC which is its inability to perform deep state exploration.

The idea of partitioning previously was used to discuss a function representation scheme called POBDDs. Given a Boolean function $f$: $B^n \rightarrow B$, defined over n inputs $X_n = \{x_1, \ldots, x_n\}$, the POBDD representation $\chi_f$ of $f$ is a set of k function pairs, $\chi_f = \{(X_1, f_1), \ldots, (w_k, f_k)\}$ where, $w_i$: $B^n \rightarrow B$ and $f_i$: $B^n \rightarrow B$, are also defined over $X_n$ and satisfy the following conditions: $w_i$ and $f_i$ are ROBDDs respecting the variable ordering $\pi$, for $1 \leq i \leq k$; $w_1 \vee w_2 \vee \ldots \vee w_k = 1$; $w_i \wedge w_j = 0$, for $i \neq j$; and $f_i = w_i \wedge f$, for $1 \leq i \leq k$. The set $(w_1, \ldots, w_k)$ is denoted by W. Each $w_i$ is called a window function and represents a partition of the Boolean space over which $f$ is defined. Each partition is represented separately as a Reduced Ordered BDD (ROBDD) and can have a different variable order. Most ROBDD-based algorithms can be adapted easily for POBDDs.

POBDDs are canonical and various Boolean operations can be efficiently performed on them just like ROBDDs. In addition, they can be exponentially more compact than ROBDDs for certain classes of functions. The practical utility of this representation is also demonstrated by constructing ROBDDs for the outputs of combinational circuits.

Particular embodiments include such window-based state partitioning. The reason for this is that this representation is canonical and allows negation to be performed locally in each partition. Other schemes for dividing the state sets need to perform a global synchronization operation to perform negation, which can be expensive.

The SAT-BMC may be based on any suitable framework, such as the framework as described below. A temporal logic property p is given to be verified on a finite transition system M. M may have a single initial state I and the property p may be an invariant. The BMC problem is posed on a k-time-frame unrolled Iterative Logic Array (ILA) of M. A module $\overline{P}$ is a monitor that checks for the violation of property p in a particular time-frame. Thus, the circuit encodes the condition that there exists a counter-example to p in the space of all executions of M of length at most k, starting with the initial state I. This circuit is typically translated into a CNF formula and decided by a conventional SAT solver such as the zchaff SAT solver. A satisfying assignment returned by the SAT solver translates to a counter-example top while an unsatisfiable formula guarantees error-free behavior of M up to k depth of behavior. In the latter case, the process is usually iterated by increasing k by n time-frames (referred to as the step size of the BMC problem in the sequel) until a violation of property p is detected or a user specified bound on k or some resource constraints are exceeded.

Particular embodiments include the following approaches to determine the initial seed states for SAT. First, a small number of BDD-based partitions are fully explored and the implementation creates a new seed after a fixed number of image computations, for example, every five images. To do this, a snapshot of the reachable states is taken and a subset of those states is used to seed the SAT solver. It is critical to pick a small number of states and not all of the states; otherwise, the SAT solver can choke as it gets a very large number of clauses. In an embodiment, the under-approximation is performed simply by picking a few random states from the set. The quality of this approximation can be further improved, especially with input from a designer, for instance by using guided traversal. The SAT solver instance executes a BMC-like algorithm from the seed obtained. Typically, the SAT-BMC runs to a small depth of twenty, as this can be computed in a matter of minutes using zchaff SAT solver. The SAT instances are run separately rather than running a single instance of SAT from their union. This is because seed states from different portions of the state-space may be very dissimilar and if they are combined together in generating the clauses for SAT, the effectiveness of the SAT solver may reduce drastically.

Particular embodiments provide a sound procedure that is fairly clear by construction. For example, if an error is detected, then it is indeed a real error in the design and a trace is generated from an initial state to the state with an error. Bounded completeness to a certain depth can be achieved by adding the initial set of states to every seed set passed to BMC. Alternatively, the same result may occur by running BMC separately from the initial states—then the design is guaranteed to be error-free until this depth.

To summarize, particular embodiments for analyzing circuit 12 have the following two stages:

Generating Deep Seeds. A full traversal is performed of the state-space by partitioning the TR, as well as the computed sets of states so that both the graphs and associated calculations remain tractable. When the BDD calculations are no longer manageable, successive under-approximations are performed. At each step of image computation, a subset of the actual set of states is used. Such under-approximation may result in successive traversal that does not always lead to a deeper state. However, probabilistically speaking, if the number of states in any computed image set is more than the sum in the previous steps, as is often the case, there is a high probability that with successive application of smaller image functions obtained from a partition of the TRs, most states in the path of deep-traversal will indeed be deep.

Parallel Seed SAT. To determine the initial seed states for SAT, two approaches are used. First, a small number of BDD-based partitions are explored fully and CNF clauses are written out at regular intervals. Alternatively, a large number of partitions are explored very rapidly with under-approximation, and the resulting deep states are used to seed SAT. At least a subset of the BMC executions start from a deep state by making multiple BMC runs start from various points along the state traversal. Since all BMC runs can be made in parallel, this leads to a non-traditional method of parallelizing BMC.

In particular embodiments, the basic algorithm that provides for deep BMC using one or more grids 16 may include the following steps:

1. Partition_reach: Use state partitioning in reachability to get different and divergent paths exploring state-space.
2. Approx_Partition_reach: Do reachability analysis with massive under-approximation—during each image computation, pick a subset of the newly found reachable states and add it to reachable set in order to avoid BDD blowup problems.
3. Generate_seed: At regular intervals, whenever a seed generation threshold is crossed, store the seeds and pass it to a new instance of the SAT solver.
4. Start_Seeded_SAT: From each of these seeds, run an instance of SAT-based BMC up to a small enough depth.
5. Run_in_Parallel: Run one SAT instance on each subgrid 18 or node 20 of grid 16.
6. Termination_condition: Allow BDD exploration and all SAT explorations to continue in parallel until an error is detected or timeout is reached.

Starting from such a potential deep state, multiple BMC runs may be able to reach further deep states and locate errors, which existing techniques may not reach. For deep exploration, the methodology includes using manageable-sized BDDs, which are achieved by using partitioning and under-approximation. The size of BDDs is controlled and many instances of BMC are run in parallel, each seeded by a state that is obtained from BDD-based reachability.

The soundness of the procedure is fairly clear by construction. For example, if an error is detected, then it is indeed a real error in the design and a trace is generated from an initial state to the state with an error. Bounded completeness, completeness to a certain depth, can be achieved by adding in the initial set of states to every seed set passed to BMC. Alternatively, the same result may occur by running BMC separately from the initial states—then the design is guaranteed to be error-free until this depth.

Figure 2:
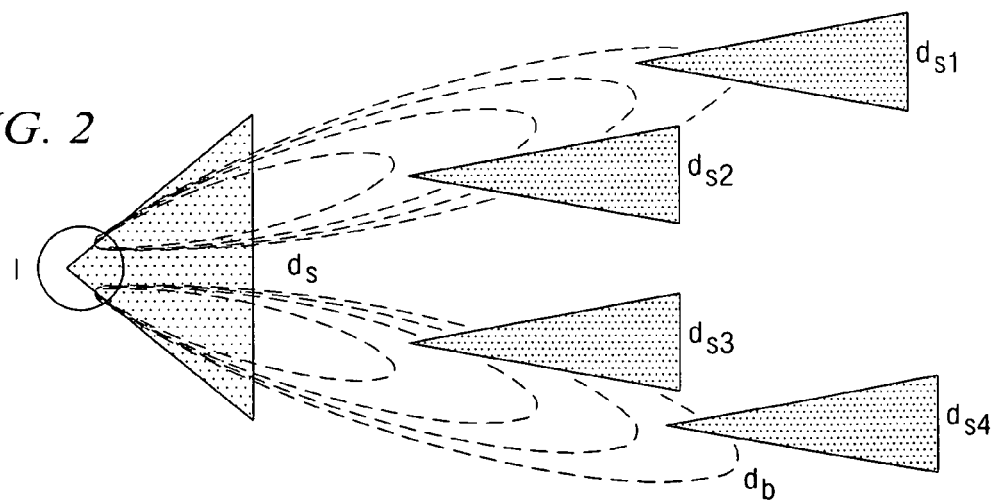
FIG. 2 conceptually illustrates an example analysis of one or more circuits using multiple seeded SAT-BMC runs distributed across one or more grids.

FIG. 2 conceptually illustrates an example analysis of one or more circuits using multiple seeded SAT-BMC runs distributed across one or more grids. The triangles represent a search using SAT, and the ellipses denote successive image computations using BDDs. The depth of the initial BDD stage is $d_b$ and the depth of the SAT stage is $d_s$. The combination described is guaranteed at least one state to a depth of max $(d_b, d_s)$ and is guaranteed to be error-free to depth $d_s$. In terms of completeness, this is no worse than BMC and at the same time, it also has some deeper seeds. Empirically, these deeper seeds are very effective in locating errors. From the initial states, BMC can only proceed to depth $d_s$ effectively. Instead, in the proposed approach, BDDs go to a depth $d_b$, and many instances of SAT are seeded until then, which may be effective to differing depths $d_{s1}, d_{s2} \ldots d_{sn}$. Consequently, this can reach errors that are otherwise difficult to catch.

Figure 3:
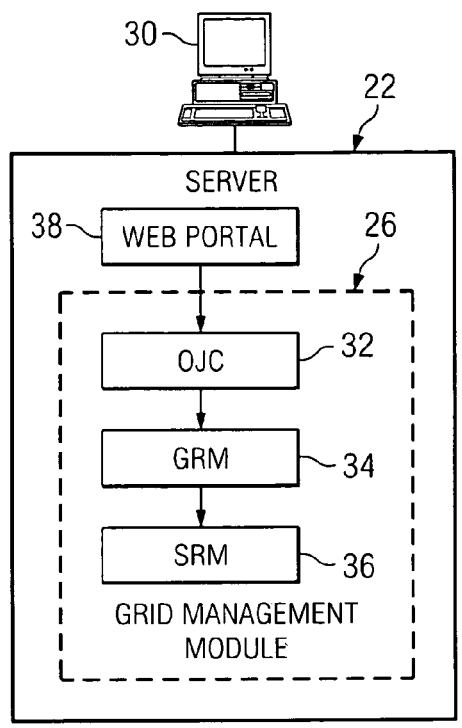
FIG. 3 illustrates an example grid management module in the system illustrated in FIG. 1.

FIG. 3 illustrates an example grid management module 26. In particular embodiments, grid management module 26 is a CyberGRIP. CyberGRIP includes three components: an OJC 32, a grid resource manager (GRM) 34, and a site resource manager (SRM) 36. OJC 32 controls how CyberGRIP executes the submitted jobs. GRM 34 determines the optimum computing resources and manages the communication between nodes 20. Each node 20 has an associated SRM 36. SRM 36 for a Windows personal computer is called the Grid Mediator for Windows (GMW) manager. Each server 22 has middleware to communicate with its SRM 36 and to execute jobs.

CyberGRIP can realize an environment in which the user can submit jobs to virtualized computing resources consisting of not only Solaris and Linux machines but also Windows machines for office use via Web portal 38 of server 22. A user at computer system 30 can do this without being aware of the performance and other characteristics of nodes 20. For a Solaris or Linux machine as server 22, a general batch system, for example, Condor, can be used as grid management module 26. With a Window machine as server 22, the GMW client corresponding to the GMW manager must be installed in the machine. CyberGRIP allows users to submit jobs to virtualized nodes 20 for use via a Web portal 38 of server 22. The user can do this without being aware of the performance and other characteristics of the individual nodes 20. Once an error is detected, all nodes 20 on grid 16 cease working on the problem.

Figure 4:
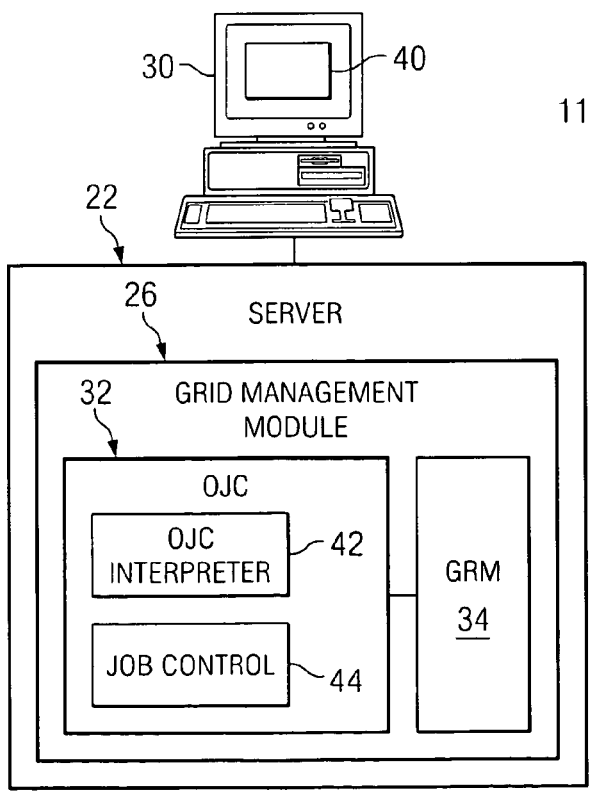
FIG. 4 illustrates an example organic job controller (OJC) in the grid management module illustrated in FIG. 3.

FIG. 4 illustrates an OJC 32. A user at computer system 30 communicates with OJC 32 to execute a job through OJC script 40. OJC interpreter 42 interprets the inter-job dependencies. OJC interpreter 42 sends a creation and change of tree structure to job control 44. Job control 44 selects a job and sends that selection to OJC interpreter 42, which sends the job execution request to GRM 34. Upon completion of the job, GRM 34 notifies OJC interpreter 42.

Figure 5A:
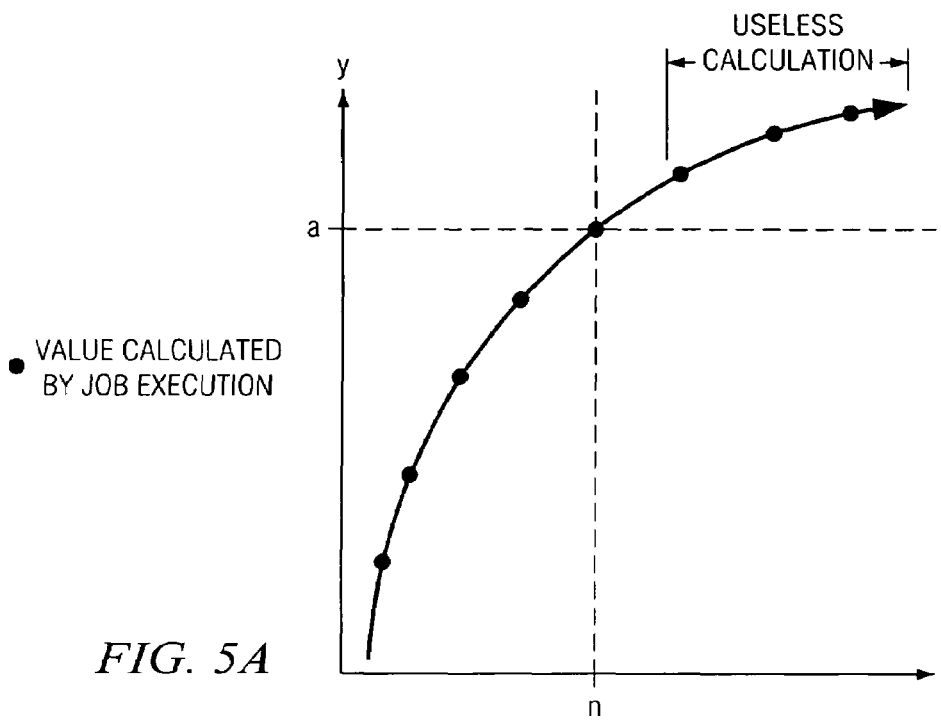
FIG. 5 illustrates example dynamic job control (DJC) by the OJC in illustrated in FIG. 4.
Figure 5B:
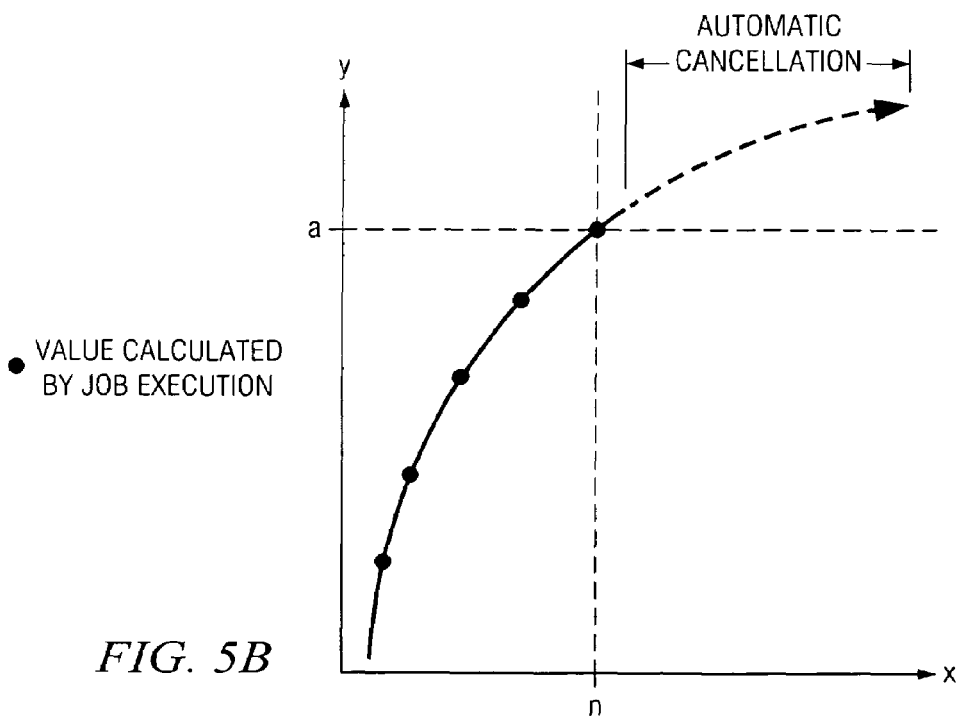

FIG. 5 illustrates example DJC by OJC 32. The DJC function works when the number of jobs to be executed cannot be decided statically at the initial job entry and when the number of jobs to be executed varies dynamically. Conventionally, because it was difficult to automatically perform DJC, operators usually took one of two approaches: executing all the jobs that had been submitted without considering which ones needed to be executed, or individually deciding whether to execute each job based on the execution results of the previously executed job. Both of these approaches proved inefficient. By automating these decisions, OJC 32 significantly increases the efficiency of job execution.

Figure 6:
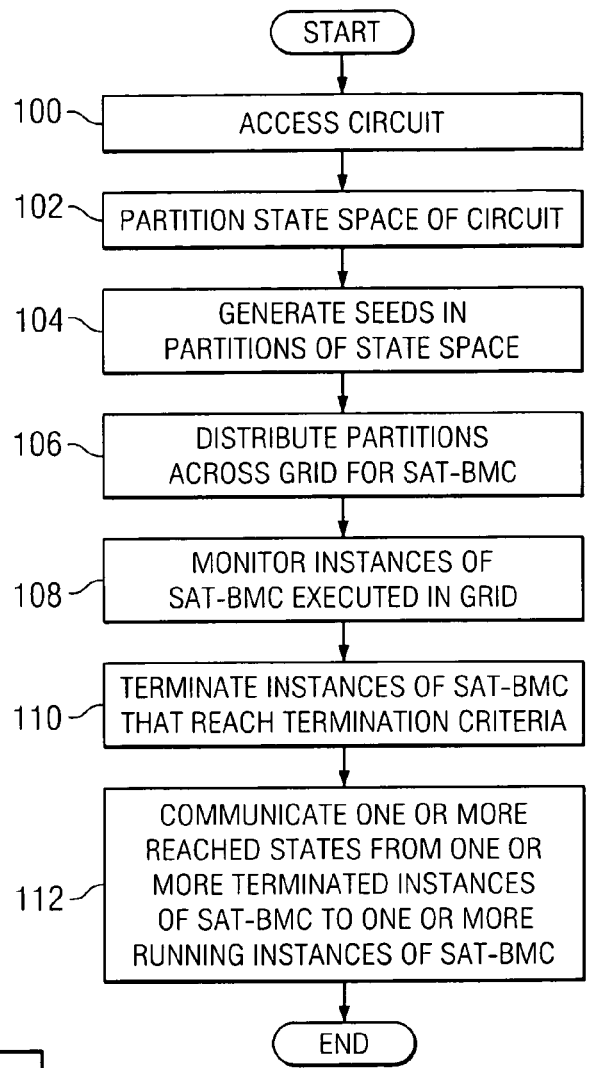
FIG. 6 illustrates an example method for analyzing one or more circuits using one or more grids.

FIG. 6 illustrates an example method for analyzing one or more circuits using one or more grids 16. The method begins at step 100 where server 22 automatically, or in response to input from a user at computer system 30, accesses a circuit 12 for testing. At step 102, server 22 partitions a state-space of circuit 12 into multiple partitions. At step 104, server 22 generates a seed in each partition for executing an instance of SAT-BMC on the partition. In particular embodiments, as described above, a seed is one or more initial states for executing an instance of SAT-BMC. At step 106, server 22 distributes the partitions of the state-space of circuit 12 across grid 16. In particular embodiments, as described above, server 22 distributes each partition to a subgrid 18 of grid 16. Each subgrid 18 executes an instance of SAT-BMC on the partition distributed to it. In particular embodiments, one or more first instances of SAT-BMC executed at one or more first subgrids 18 differ from one or more second instances of SAT-BMC executed at one or more second subgrids 18. As an example and not by way of limitation, the first instances of SAT-BMC may run according to a first set of one or more parameters and the second instances of SAT-MC may run according to a second set of parameters different from the first set of one or more parameters.

At step 108, while subgrids 18 execute the instances of SAT-BMC on the partitions of the state-space of circuit 12, server 22 monitors each instance of SAT-BMC. At step 110, if an instance of SAT-BMC executed at subgrid 18 reaches one or more termination criteria, server 22 terminates that instance of SAT-BMC at subgrid 18. As an example and not by way of limitation, a termination criterion may include significant memory blowup, a predetermined amount of time lapsing without reaching a new state, another termination criterion or a combination of two or more such criterion. At step 112, server 22 communicates one or more reached states from the partition associated with the terminated instance of SAT-BMC to one or more other partitions associated with one or more running instances of SAT-BMC at one or more other subgrids 18, at which point the method ends. In particular embodiments, server 22 continues SAT-BMC on circuit 12 using grid 16 until the SAT-BMC detects one or more errors in one or more partitions of the state-space of circuit 12 or until all instances of SAT-BMC meet one or more termination criteria, whichever comes first. When server 22 discontinues SAT-BMC on circuit 12 using grid 16, server 22 communicates one or more results of the test of circuit 12 for analysis by one or more users. Although particular steps of the method illustrated in FIG. 6 have been illustrated and described as occurring in a particular order, any suitable steps of the method illustrated in FIG. 6 may occur in any suitable order.

Figure 7:
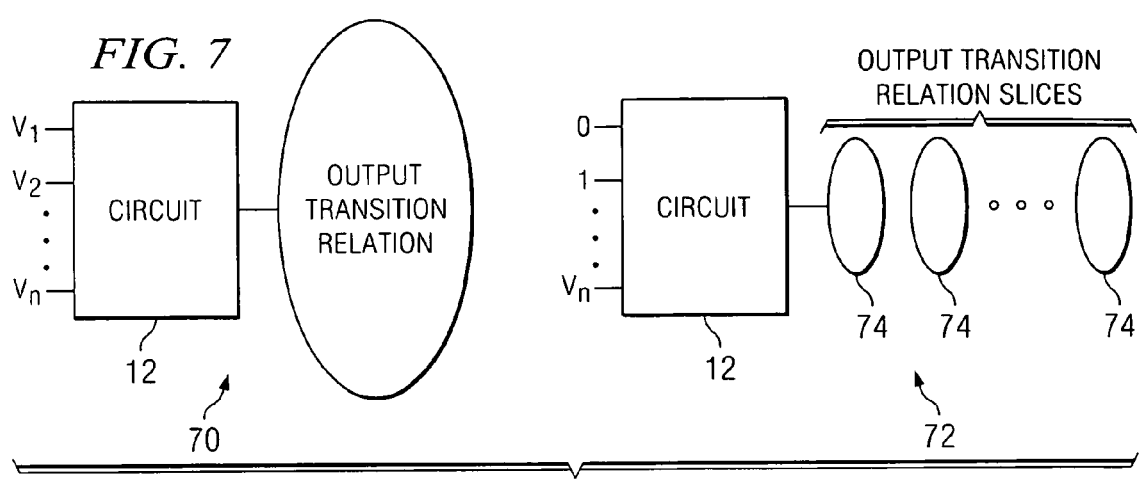
FIG. 7 illustrates example processing of one or more relatively large circuits for analysis.
Figure 8:
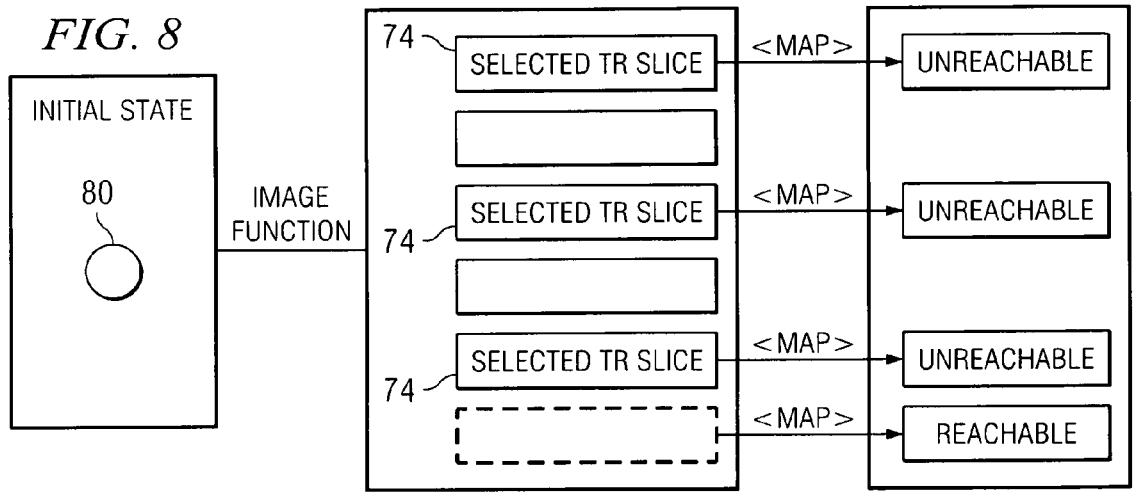
FIG. 8 further illustrates example processing of one or more relatively large circuits for analysis.
Figure 9:
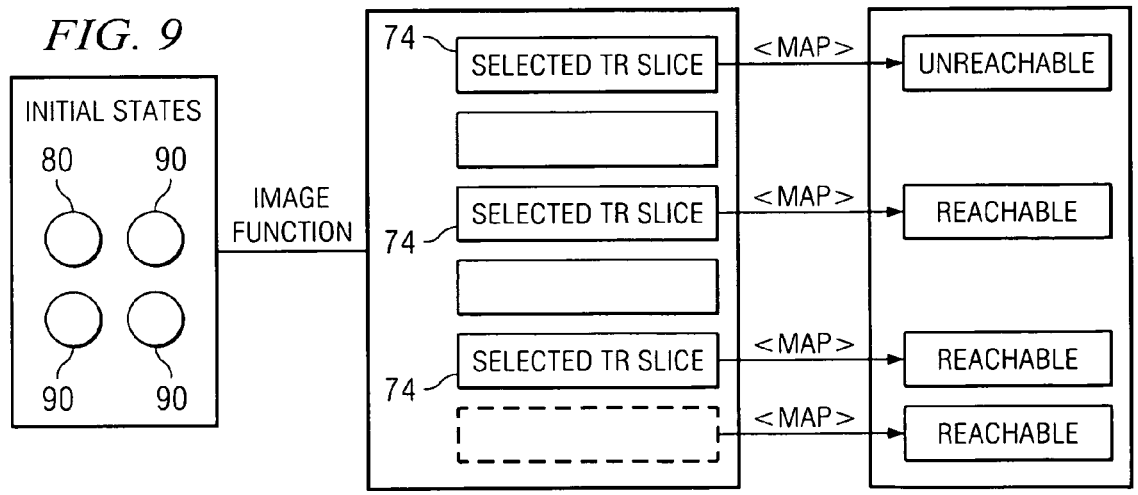
FIG. 9 illustrates an example use of one or more simulations to facilitate deep BMC.

FIG. 7 illustrates example processing of one or more relatively large circuits 12 for analysis. Using deep BMC for large circuits 12 is a desirable goal. TRs are essential to find deep, reachable states; however, TR for large circuits 12 cannot be constructed. In particular embodiments, slicing circuit 12 may be a suitable approach. This includes using partial assignments for size reduction. The resulting method sees part of the state-space, which is less than executing a full BMC, but sees more than if only simulation is executed. Process 70 illustrates processing large circuits 12 without slicing. In process 70, TR is not constructed but a BDD blowup occurs. Therefore, no TR is made, there is no reachability, and no deep BMC may execute. Process 72 illustrates processing large circuits 12, which has many partitions, after slicing. In process 72, the output includes numerous TR slices 74, and each TR slice 74 is given to subgrid 18 or node 20 to execute an instance of BMC. FIG. 8 further illustrates example processing of one or more relatively large circuits for analysis. Now that TR slices 74 exist, the problem remains whether TR slices 74 catch any valid transitions. Each TR slice 74 may capture a small subset of valid transitions; however, the transitions may not be captured from initial state 80. FIG. 9 illustrates an example use of one or more simulations to facilitate deep BMC. In particular embodiments, initial states 80 may be augmented by adding other valid initial states 90. Initial states 90 are added using simulation. Each TR slice 74 is aligned with a set of initial sets 90 to allow each TR slice 74 to capture valid transitions from initial state 90.

FIG. 10 illustrates an example method for processing one or more relatively large circuits 12 for analysis. The method begins at step 150 where a circuit 12 is simulated to generate a set of reachable states. Through simulation of circuit 12 from the initial state, a set of reachable states is found. The reachable states are used to simplify the design further. In particular embodiments, M vectors may be generated from the set of reachable states. At step 152, server 22 examines vectors to generate assignment values to one or more latch variables for circuit 12. In particular embodiments, a subset of N latch variables may be generated using the assignment values by examining the M vectors in the above-created database simulation output. Additionally, P partial assignments may be produced. The latch variables can be selected using a depth-first search (DFS) or through any suitable approach. Server 22 reduces circuit 12 using the one or more values assigned to the one or more latch variables at step 154. In particular embodiments, a synthesis approach may be used to simplify the resulting circuit, such as SWEEP in SIS, the University of California at Berkeley's multi-level synthesis tool. In particular embodiments, a static abstraction may reduce the size of circuit 12 even before processing begins on circuit 12. At step 156, a determination is made as to whether circuit 12 successfully reduces. If circuit 12 does not reduce, the process continues from step 154 using another assignment value and/or latch variable. If circuit 12 does reduce, a TR for each one of the one or more reduced circuits is generated at step 158. At step 160, server 22 generates seeds using the reachable states not used to generate assignment values. In particular embodiments, fewer seeds are used at the beginning, but the number of seeds dynamically increases if image computation is ineffective. At step 162, server 22 executes an instance of SAT-BMC on each TR slice in parallel using the seeds generated in step 160. In particular embodiments, server 22 may reach deep states of circuit 12 without going through BDDs, but just using simulation. Although particular steps of the method illustrated in FIG. 10 have been illustrated and described as occurring in a particular order, any suitable steps of the method illustrated in FIG. 10 may occur in any suitable order.

Particular embodiments have been used to describe the present invention, and a person having ordinary skill in the art may comprehend one or more changes, substitutions, variations, alterations, or modifications to the particular embodiments used to describe the present invention. The present invention encompasses all such changes, substitutions, variations, alterations, and modifications within the scope of the appended claims.

What is claimed is:

1. A method comprising:

accessing a circuit;

generating one or more seeds from one or more binary decision diagrams (BDDs) for executing two or more instances of validation of the circuit, the one or more BDDs representing one or more state spaces of the circuit, each instance being executable to validate one or more portions of the circuit, each instance comprising one or more tasks, each task comprising a particular portion of the instance comprising it;

distributing to each of two or more nodes one or more particular ones of the one or more seeds and one or more particular ones of the one or more instances, each node comprising one or more computer systems operable to perform one or more of the one or more tasks of the one or more particular instances distributed to the node; and using the one or more seeds, executing the two or more instances at the two or more nodes independent of and in parallel with each other, the execution of each of the two or more instances comprising executing satisfiability (SAT) based bounded model checking (BMC) starting from one of the one or more seeds.

2. The method of claim 1, further comprising:

monitoring the execution of each of the two or more instances; and if a first one of the two or more instances reaches one or more termination criteria, terminating the first instance.

3. The method of claim 2, further comprising, after terminating the first instance, communicating one or more reached states from the first instance to one or more second ones of the two or more instances.

4. The method of claim 3, further comprising continuing the execution of the second instances using the reached states communicated to the second instances.

5. The method of claim 1, further comprising:

partitioning a state-space of the circuit;

in each of the partitions, generating one or more of the one or more seeds;

distributing the partitions to each of the two or more nodes with the one or more particular ones of the one or more seeds and the one or more particular ones of the one or more instances; and executing each instance on one or more of the partitions.

6. The method of claim 5, further comprising under-approximating the partitions to control sizes of BDDs associated with the partitions.

7. The method of claim 1, wherein one or more of the two or more instances each comprises:

one or more instances of formal verification (FV) of the circuit that each covers less than an entire state space of the circuit.

8. The method of claim 1, wherein two or more of the nodes are heterogeneous with respect to each other.

9. A program embodied in a computer readable storage device for execution by a computer to perform operations comprising:

access a circuit;

generate one or more seeds from one or more binary decision diagrams (BDDs) for executing two or more instances of validation of the circuit, the one or more BDDs representing one or more state spaces of the circuit, each instance being executable to validate one or more portions of the circuit, each instance comprising one or more tasks, each task comprising a particular portion of the instance comprising it;

distribute to each of two or more nodes one or more particular ones of the one or more seeds and one or more particular ones of the one or more instances, each node comprising one or more computer systems operable to perform one or more of the one or more tasks of the one or more particular instances distributed to the node; and using the one or more seeds, execute the two or more instances at the two or more nodes independent of and in parallel with each other, logic to execute each of the two or more instances comprising logic to execute satisfiability (SAT) based bounded model checking (BMC) starting from one of the one or more seeds.

10. The program of claim 9, further operable to:

monitor the execution of each of the two or more instances; and if a first one of the two or more instances reaches one or more termination criteria, terminate the first instance.

11. The program of claim 10, further operable, after terminating the first instance, to communicate one or more reached states from the first instance to one or more second ones of the two or more instances.

12. The program of claim 11, further operable to continue the execution of the second instances using the reached states communicated to the second instances.

13. The program of claim 9, further operable to:

partition a state-space of the circuit;

in each of the partitions, generate one or more of the one or more seeds;

distribute the partitions to each of the two or more nodes along with the one or more particular ones of the one or more seeds and the one or more particular ones of the one or more instances; and execute each instance on one or more of the partitions.

14. The program of claim 13, further operable to under-approximate the partitions to control sizes of BDDs associated with the partitions.

15. The program of claim 9, wherein one or more of the two or more instances each comprises:

one or more instances of formal verification (FV) of the circuit that each covers less than an entire state space of the circuit.

16. The logic of claim 9, wherein two or more of the nodes are heterogeneous with respect to each other.

17. A system comprising:

means for accessing a circuit;

means for generating one or more seeds from one or more binary decision diagrams (BDDs) for executing two or more instances of validation of the circuit, the one or more BDDs representing one or more state spaces of the circuit, each instance being executable to validate one or more portions of the circuit, each instance comprising one or more tasks, each task comprising a particular portion of the instance comprising it;

means for distributing to each of two or more nodes one or more particular ones of the one or more seeds and one or more particular ones of the one or more instances, each node comprising one or more computer systems operable to perform one or more of the one or more tasks of the one or more particular instances distributed to the node; and means for, using the one or more seeds, executing the two or more instances at the two or more nodes independent of and in parallel with each other, the execution of each of the two or more instances comprising executing satisfiability (SAT) based bounded model checking (BMC) starting from one of the one or more seeds.

* * * * *